July 18, 1967 N. KOVALEVSKI 3,332,035

OSCILLATOR CIRCUIT WITH VARIABLE CAPACITOR

Filed July 20, 1966 2 Sheets-Sheet 1

INVENTOR
NICHOLAS KOVALEVSKI

BY Harvey G. Lowhurst

ATTORNEY

July 18, 1967 N. KOVALEVSKI 3,332,035

OSCILLATOR CIRCUIT WITH VARIABLE CAPACITOR

Filed July 20, 1966 2 Sheets-Sheet 2

INVENTOR

NICHOLAS KOVALEVSKI

BY Harvey G. Lowhurst

ATTORNEY 3,332,035

OSCILLATOR CIRCUIT WITH VARIABLE CAPACITOR

Nicholas Kovalevski, Menlo Park, Calif., assignor to Alfred Electronics, Palo Alto, Calif., a corporation of California Filed July 20, 1966, Ser. No. 566,554
11 Claims. (Cl. 331—117)

This invention relates in general to oscillator circuits, and relates more particularly to such circuits employing a variable capacitor as the controlling element thereof.

It has been well-known in the art for many years to utilize oscillators employing tuned LC circuits, such as Hartley, Colpitts or Clapp oscillators, where the variable capacitance is provided by a varactor whose capacitance varies with the reverse bias applied thereof. As is known in the art, a varactor is a semiconductor device which is operable to vary its capacitance in response to variations in a control signal applied thereto. A description of such devices is contained, for example, in "Microwave Solid-State Engineering" by L. S. Nergaard and N. Glicksman, Chapter 3, pages 45–48, published by Van Nostrand in 1964. These prior art circuits are capable of providing an effective range of control of output frequency in the frequency range where the parameters of the transistors or vacuum tubes associated therewith, such as transconductance, are essentially independent of frequency. However, at higher frequencies where the dependence of transistor's or vacuum tube's parameters upon frequency becomes more pronounced, the range of frequency control obtainable with these prior art devices is severely limited unless auxiliary variable elements requiring tracking are provided.

In accordance with the present invention, there is provided a transistor oscillator which is capable of providing a wide range of frequency control at frequencies approaching the $f_T$ frequency by means of a single variable impedance in the form of a varactor. This is accomplished in the present invention by taking into account the frequency dependence of the active device parameters, such as transistor or vacuum tubes, in the circuit, and by choosing circuit configurations which satisfy the conditions for starting oscillations for a wide frequency range. With a constant load and a given frequency dependence of the pertinent circuit components, and with the assumption that only a single variable reactance is available to set the particular frequency of oscillation, the element values of the circuit may be properly dimensioned to produce the desired frequency range.

In the present invention, the varactor employed does not operate like those utilized in the prior art devices to form a tuned LC circuit, and the frequency of oscillation does not coincide with the resonant frequency of the LC combination. This difference is made clear in the present invention by the fact that the varactor employed herein is utilized even when it is biased in the forward or conducting direction, during which time it operates as a resistor with a very low resistance. Thus, since it is operating as a variable resistor over part of the range of oscillations, it is obvious that it is not performing like the usual variable capacitor in a tuned LC circuit.

It is therefore an object of this invention to provide an improved oscillator circuit employing a varactor as an element thereof.

It is a further object of the present invention to provide an improved oscillator circuit employing a varactor therein which is controlled to vary the output frequency of the oscillator.

It is an additional object of this invention to provide an oscillator circuit employing a varactor therein, the varactor being controlled to operate both as a variable capacitor and a variable resistor.

It is a further object of the present invention to provide an oscillator circuit employing a varactor therein, the varactor being controlled to operate as a variable capacitor over one portion of the output frequency range, and being controlled to operate as a variable resistor over another portion of the output frequency range.

It is an additional object of this invention to provide an oscillator circuit for very high frequencies employing a varactor where the frequency-dependent parameters of the other oscillator circuit components are utilized in conjunction with control of the varactor to determine the output frequency of the oscillator.

Further objects and advantages of the present invention will become apparent to those skilled in the art to which the invention pertains as the ensuing description proceeds.

The features of novelty that are considered characteristic of this invention are set forth with particularly in the appended claims. The organization and method of operation of the invention itself will best be understood from the following description when read in connection with the accompanying drawings in which:

Figure 1:
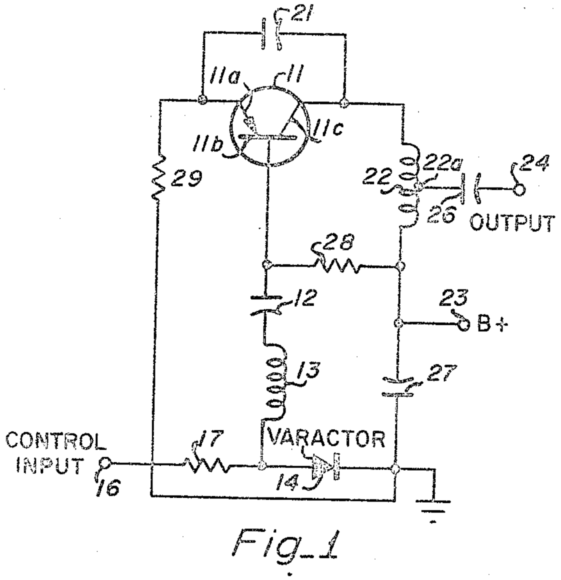
FIGURE 1 is a diagram of one embodiment of the invention having a varactor connected to the base of a transistor.

Referring to FIGURE 1, there is shown one embodiment of the invention utilizing a varactor connected to the base of a transistor. This embodiment includes a transistor 11 having an emitter 11*a*, a base 11*b* and a collector 11*c*. Base 11*b* is connected through a D.C. blocking capacitor 12 to an inductor 13 and a varactor 14. As indicated above, varactor 14 is a semiconductor device which is operable to vary its capacitance in response to variations in a control voltage applied thereto. This variable control voltage is supplied to varactor 14 from a control source, represented by terminal 16, through a resistor 17.

The circuit also includes a feedback capacitor 21 connected across collector 11*c* and emitter 11*a* of transistor 11, in order to assist in providing oscillations in the circuit, as well-known in the art. An output transformer 22 has its terminals connected between collector 11*c* and a source of B+ voltage represented by a terminal 23. Transformer 22 has an output tap 22*a* which is connected to an output circuit represented by a terminal 24, through a capacitor 26. A filter capacitor 27 may be employed between the B+ terminal 23 and one side of varactor 14. The circuit also includes a resistor 28 connected as shown, as well as a resistor 29 connected between emitter 11*a* and ground.

Figure 2:
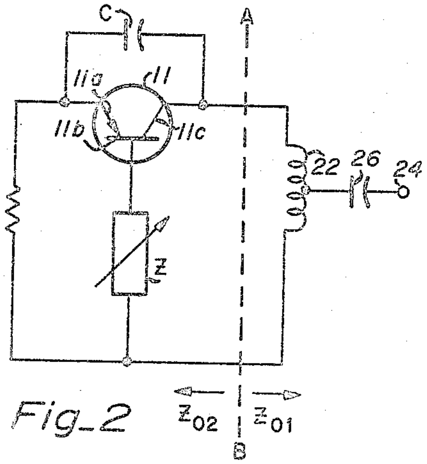
FIGURE 2 is a simplified circuit diagram of the circuit of FIGURE 1.

The operation of the circuit of FIGURE 1 may be understood from consideration of the simplified circuit diagram of FIGURE 2, which corresponds to the circuit of FIGURE 1. In FIGURE 2, transistor 11 is shown having its base 11*b* connected to a variable reactance Z, which corresponds to the combined reactance of coil 13 and veractor 14. Output transformer 22 and capacitor 26 are shown as before, while the capacitor C represents the capacitance between the collector and emitter of transistor 11. The resistor $R_1$ represents the resistance between emitter 11*a* and the lower terminal of reactance Z.

The design and operation of a sinusoidal oscillator can be explained on the linear approximation ("small signal" theory) on the assumption that greater departures from the linear model cannot be tolerated if low distortion output is to be obtained, as in the present case. There are a number of ways to describe the conditions required for starting oscillations of an active linear circuit, and for the purposes of the present invention, the concept of negative impedance will be employed. In this concept, the condition for the possibility of oscillations can be stated as follows: If the circuit is arbitrarily broken into two parts such that each part represents two 2-terminal networks facing each other, the necessary condition for the start of oscillation is that the impedance of either of the two 2-terminal networks represent the negative of the impedance of the other. Actually, for the maintenance of stable oscillations, it is required that $Re(-Z_{02})>ReZ_{01}$, where:

*Re* is the real part of the impedances, $-Z_{02}$ or $Z_{01}$, respectively, so that the oscillations can build up and only when a certain operating level is reached, due to nonlinear effects, the exact equality $-Z_{02}=Z_{01}$ is established.

If the simplified circuit of FIGURE 2 is divided into two parts along the line A–B, the conditions for the possibility of oscillation, as set forth above, is that $-Z_{01}=Z_{02}$. The quantity $Z_{02}$ depends both on frequency and on the particular value of the variable impedance Z. In order to represent $Z_{02}$ as a function of frequency, it would be necessary to draw a family of curves of $Z_{02}$ versus frequency, each curve corresponding to a particular value of the variable Z. $Z_{01}$, however, with a given load and given values of the elements comprising the network on the right of line A–B, depends only on frequency and can be represented by a single curve. However, since $Z_{02}$ and $Z_{01}$ are both complex, two curves are needed for better visualization, one for $ReZ_0$ and the other for $ImZ_0$ versus frequency, where *Im* is the imaginary part of the impedance. For the particular circuit under consideration here, $R_1$ is relatively high and Z is a pure reactance. In this case, the plot of $ReZ_{02}$ versus frequency is independent of the value of Z; the reactance of Z at any frequency adds directly to $ImZ_{02}$ at that frequency, taken when $Z=0$.

Figures 3, 4, 5:
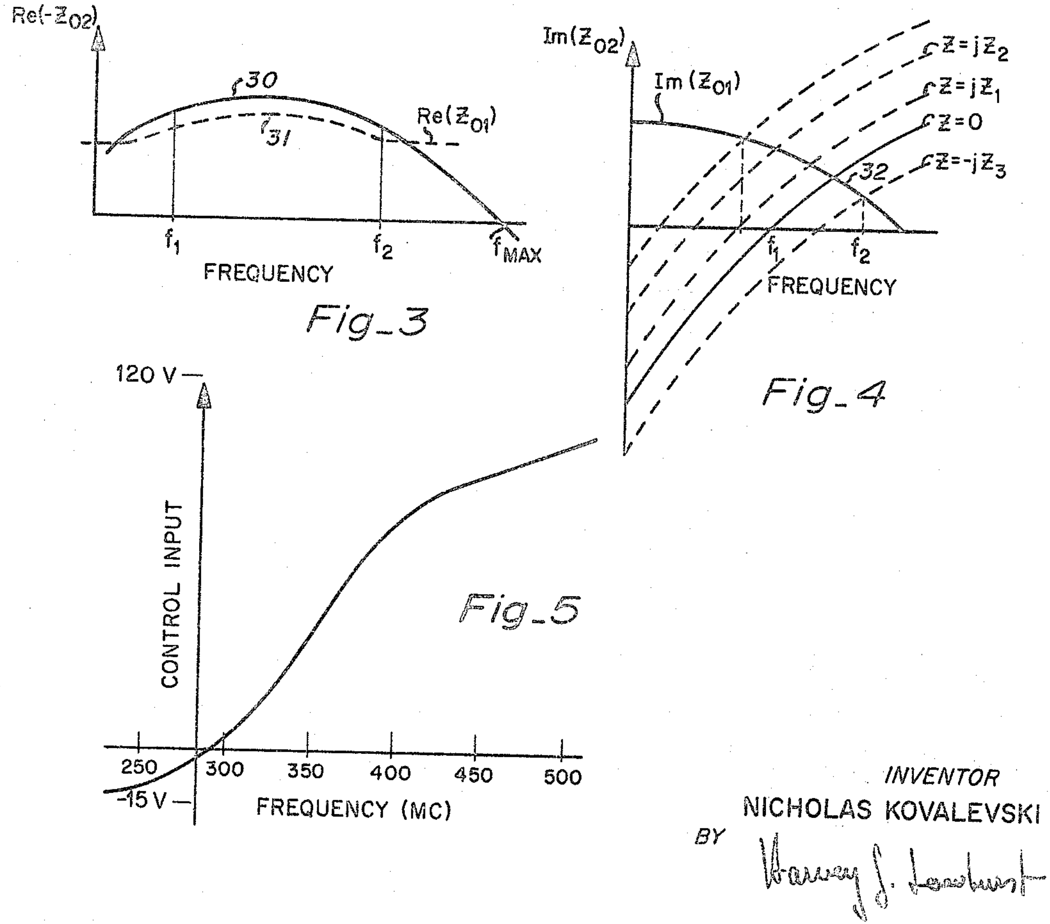
FIGURES 3 and 4 are graphs showing variations with frequency of the different circuit parameters of the circuit of FIGURE 2.
FIGURE 5 is a graph showing the variations of output frequency with applied control voltage for one embodiment of the invention.

The graph 30 of FIGURE 3 represents a plot of $Re(-Z_{02})$ versus frequency, as discussed above, and this curve is essentially the same for different values of Z. The graph 31 of FIGURE 3 represents the plot of $ReZ_{01}$ versus frequency. It will be seen that this curve matches approximately the curve 30 in shape over the range between the frequencies $f_1$ and $f_2$, and that curve 31 is located slightly lower than curve 30.

The graphs of FIGURE 4 represent the family of curves $Im(-Z_{02})$, each curve corresponding to a particular setting of the reactance Z. The curve 32 in FIGURE 4 represents the variation of $ImZ_{01}$ with frequency.

From a consideration of the curves of FIGURES 3 and 4, it will be seen that for a particular setting of Z, the frequency of oscillation will be established by the intersection of that member of the family $ImZ_{02}$ in FIGURE 4 which corresponds to $Z=Z$, with the curve $ImZ_{01}$ (curve 32). This is true because at that frequency, the conditions $Re(-Z_{02})<ReZ_{01}$ and $Im(-Z_{02})=ImZ_{01}$ will be simultaneously fulfilled.

From a practical design standpoint, the curve $$Re(-Z_{02})(Z=0)$$

is plotted for a particular value of C, on the basis of the measured transistor parameters $Y_{11}$, $Y_{12}$, $Y_{21}$ and $Y_{22}$, using $$Z_{01}=(Y_{11}+jwC)-\frac{(Y_{12}-jwC)(Y_{21}-jwC)}{Y_{22}+jwC}$$

where:

$Y_{11}$ is the small-signal, short-circuit, input-admittance;

$Y_{12}$ is the small-signal, short-circuit, feedback-admittance;

$Y_{21}$ is the small-signal, short-circuit, transfer admittance;

$Y_{22}$ is the small-signal, short-circuit, output-admittance; and $W=2\pi f$; $f$ is the particular frequency.

This procedure is repeated for several different values of C in order to optimize the end results. Then, a possibly simpler configuration for the loaded output circuit is chosen and the values of the circuit elements are determined so as to match the curves $Re(-Z_{02}$ and $Re(Z_{01})$ as closely as possible within the frequency range of interest. Next, the value of $Im(-Z_{02})(Z=0)$ is plotted and several other members of the family of curves for different values of Z; from this data, the range of variation of Z necessary to cover the desired range can be determined. Finally, knowing the desired range and choosing an appropriate commercially available varactor, the value of the inductance L is determined such that it provides the required shift from the range of values available from the chosen varactor to the range of values of Z as previously determined.

Several models of the circuit shown in FIGURE 1 have been built and operated satisfactorily for a number of different ranges of frequency. As an example of one of these circuits, the following values and element types were employed.

| | |
|---|---|
| Capacitor **12** | 680 picofarads. |
| Capacitor **21** | 1.5 picofarads. |
| Capacitor **26** | 680 picofarads. |
| Capacitor **27** | 1000 picofarads. |
| Resistor **17** | 10K. |
| Resistor **28** | 2.7K. |
| Resistor **29** | 0.27K. |
| Inductor **13** | 2 turns, #16 wire AWG, ¼" I.D.; *L*=.125'. |
| Output transformer **22** | 1 turn, ½" I.D.; *L*=.125'; tap **22***a* located ¼ turn from center. |
| Transistor **11** | 2SN3866-RCA. |
| Varactor **14** | Microwave Associates, type 43280. |

A circuit built using these values operated as indicated in the graph of FIGURE 5 to produce an output frequency range from 250 mc. to 500 mc. In addition to illustrating the frequency range available with one particular embodiment of this invention, FIGURE 5 also clearly illustrates that the present invention does not operate in a manner similar to that of the prior art oscillators employing tuned LC circuits. FIGURE 5 is a plot of the output frequency as a function of the control voltage applied to varactor 14, and it will be seen that for a part of the frequency range (from 250 mc. to approximately 290 mc.) the control voltage applied thereto is negative. Thus, varactor 14 is biased in the forward or conducting direction under these conditions, and as well-known in the art, is then acting as a resistor of low resistance rather than as a variable capacitor. Hence, during this portion of the frequency range, there can be no LC circuit formed with varactor 14, since this element is acting as a resistor during this time. In fact, the circuit of FIGURE 1 gives the full range of control only when the bias on varactor 14 is varied from the maximum permissible reverse bias to the forward bias.

Figure 6:
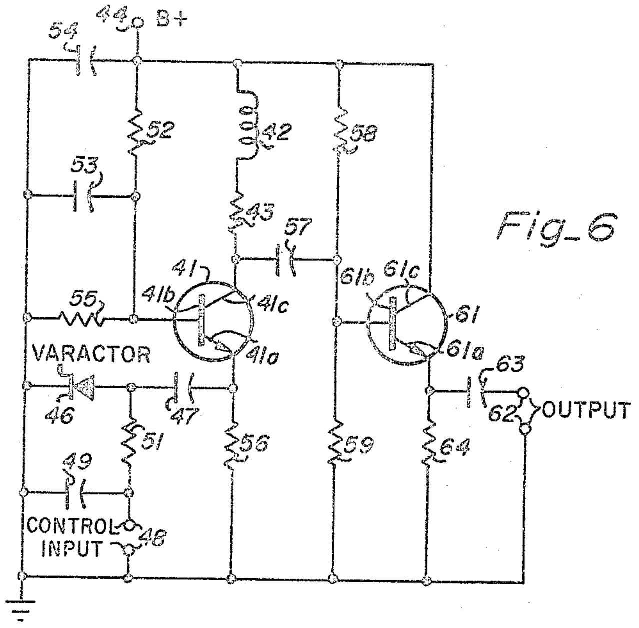
FIGURE 6 is a circuit diagram of another embodiment of the invention having a varactor connected between the emitter of a transistor in a common base configuration and ground.

FIGURE 6 illustrates an alternate embodiment of the invention which, although appearing somewhat dissimilar to the embodiment of FIGURE 1, is actually based on the same principle as discussed above in connection with FIGURE 1. In FIGURE 6, the circuit includes a transistor 41 having an emitter 41*a*, a base 41*b* and a collector 41*c*. The output circuit includes a coil 42 and a resistor 43 connected between collector 41*c* and a source of B+ potential represented by terminal 44. The circuit also includes a varactor 46 having one terminal connected through a capacitor 47 to emitter 41*a*, and having its other terminal connected to ground. A source of control signals for controlling varactor 46 is represented by terminals 48, and this signal is applied thereto through a capacitor 49 and a resistor 51 connected as shown.

The circuit further includes a resistor 52 connected between base 41*b* and the B+ terminal, and capacitors 53, 54 connected from opposite terminals of this resistor to ground. Another resistor 55 is connected between base 41*b* and ground, and a further resistor 56 is connected between emitter 41*a* and ground. The circuit has an impedance matching portion including a capacitor 57 and resistors 58 and 59. The junction of these elements is connected to the base 61*b* of a transistor 61 having an emitter 61*a* and a collector 61*c*. Transistor 61 is coupled to an output circuit represented by terminals 62 through a capacitor 63, and a resistor 64 is connected between emitter 61*a* and ground.

Figure 7:
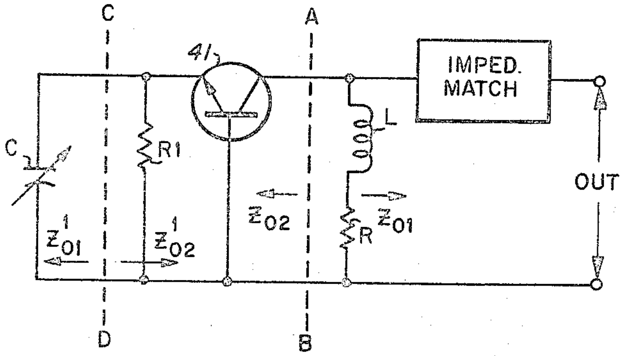
FIGURE 7 is a simplified circuit diagram of the circuit of FIGURE 6.

The equivalent simplified circuit diagram for the circuit of FIGURE 6 is shown in FIGURE 7. From this figure, it will be seen that the frequency control, which is available over more than one octave, is accomplished by varying the capacity of varactor 46 between the emitter of a transistor in a common base configuration and ground. Of course, the essential part of the circuit is represented by the output circuit formed by the combination of coil 42 and resistor 43.

The design of a circuit as shown in FIGURE 6 may proceed in a manner similar to that described above for the embodiment of FIGURE 1, except that such procedure for FIGURE 6 is more complicated because both $Re\ (-Z_{02})$ and $Im\ (Z_{02})$ requires families of curves for the representation of their dependence upon frequency and the value of Z. For this type of circuit, a polar representation is more convenient because use can be made of the fact that at each particular frequency, the dependence of $Z_{02}$ on Z is represented by a circle in the complex Z plane.

Another way to design this circuit is to break the circuit along the line C–D rather than A–B in FIGURE 7. Then, the procedure described above for FIGURE 2 is fully applicable. The circuit elements R, L should be adjusted so that $Re\ (Z'_{02})=0$ to close approximation over the desired range. The calculations required to find $Re\ (Z'_{02})$, taking into account the frequency dependent parameters of the transistor, are rather time-consuming and computers may be employed if desired, particularly since a range of different values of L and R need to be considered in order to achieve a good fit.

A circuit as shown in FIGURE 6 has been built and satisfactorily operated, utilizing components having the following values:

| | |
|---|---|
| Capacitors **49** and **54** | 1000 picofarads. |
| Capacitor **47** | 500 picofarads. |
| Capacitor **53** | 130 picofarads. |
| Capacitors **57** and **63** | 390 picofarads. |
| Resistors **55** and **59** | 8.2K. |
| Resistors **52** and **58** | 2.7K. |
| Resistors **56** and **64** | .82K. |
| Inductor **42** | 3 turns, #21 wire; I.D.=.25″; L=.275″. |
| Varactor **46** | Microwave Associates, type 4061B. |
| Transistors **41** and **61** | 2N2857–RCA. |

In both the embodiment of FIGURE 1 and that of FIGURE 6, it will be seen that the invention involves the use of the frequency dependence of the transistors in the circuit as a part of the oscillator, and that a varactor, augmented where necessary by an inductor, provides the variable reactance which controls the frequency of the oscillator. Further, the circuit including the varactor is not in resonance at the operating frequency.

A further advantage of the embodiments of FIGURES 1 and 6 is the placement of the varactor in a part of the circuit such that both the RF current through the varactor and the RF voltage across it are particularly low. In the embodiment of FIGURE 1, the varactor is in the base circuit where the current is low as compared to other parts of the circuit. In the embodiment of FIGURE 6, the varactor is in the emitter circuit where the RF voltage across it is low, compared to voltages in other parts of the circuit. Moreover, since the varactor at operating frequency is not a part of a resonant circuit, there is no Q multiplication of currents or voltages. The net result of the above-mentioned conditions is that the distortion of the output wave is low, even at outputs of several hundred *m*W and even at the times when the varactor operates in the transition range between forward and reverse bias.

Figure 8:
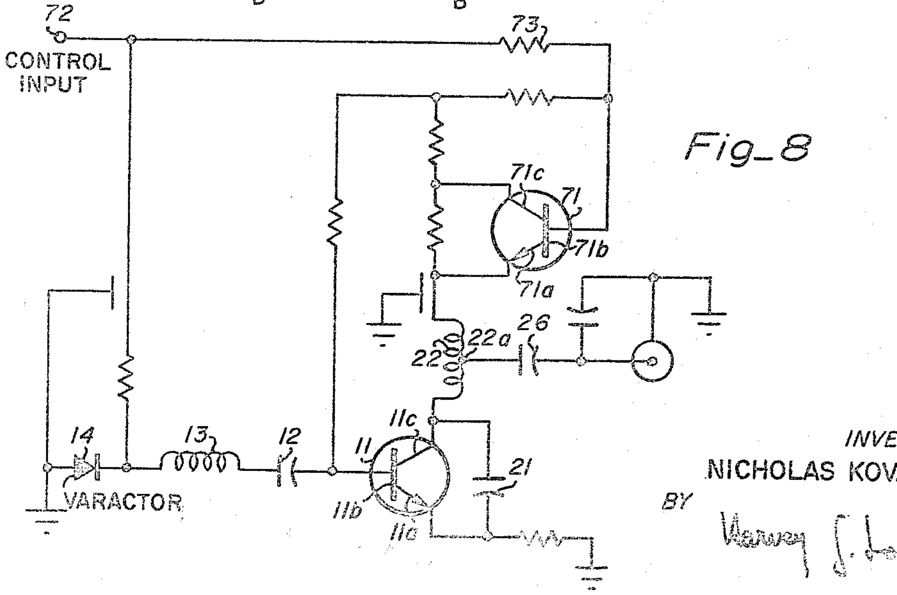
FIGURE 8 is a circuit diagram of an additional alternate embodiment providing a greater range of frequency control.

FIGURE 8 illustrates an alternate embodiment of the invention useful for extending the range of control available. This circuit is generally similar to that of FIGURE 1, but it includes an additional transistor 71 having an emitter 71*a*, a base 71*b* and a collector 71*c*. Base 71*b* is connected through a resistor 73 to the terminal 72 to which the control voltage is applied to control varactor 14. This connection has the effect of lowering the voltage across the main oscillator transistor 11 when the applied control voltage on terminal 72 corresponds to the lower end of the frequency range. This has the effect of increasing the collector-base capacity to thus extend the total control range more toward the lower frequency.

As an additional refinement of the embodiment shown in FIGURE 8, instead of connecting the base of transistor 71 to the control input terminal 72, this base may be supplied with a suitable signal for the purposes of automatic level control.

While the above detailed description has shown, described and pointed out the fundamental novel features of the invention as applied to various embodiments, it will be understood that various omissions and substitutions and changes in the form and details of the device illustrated may be made by those skilled in the art, without departing from the spirit of the invention. It is the intention, therefore, to be limited only as indicated by the scope of the following claims.

What is claimed is:

1. A variable frequency oscillator, comprising:

a transistor device having characteristics which vary as a function of frequency, said transistor having a base electrode, a collector electrode and an emitter electrode;

an output inductor connected to said transistor;

a varactor connected to said transistor; and a source of control signals connected to said varactor, said control signals being variable over a predetermined range for varying the characteristics of said varactor to thereby vary the frequency of the voltage across said output inductance, said varactor operating as a variable capacitor in one portion of said range of said control signals and operating as a variable resistor in another portion of said range of said control signals.

2. Apparatus in accordance with claim 1 in which said frequency-dependent characteristics of said transistor form a portion of the frequency-determining properties of said oscillator.

3. Apparatus in accordance with claim 1 including a second inductor connected to said varactor, said second inductor and said varactor having a combined impedance Z which determines the frequency of oscillations of said oscillator.

4. Apparatus in accordance with claim 3 in which said source of control signals is connected between said varactor and said second inductor.

5. Apparatus in accordance with claim 1 including a second transistor having a base electrode, a collector electrode and an emitter electrode;

means connecting said collector electrode and said emitter electrode in circuit with said inductor; and means connecting said base electrode to said control signal source to increase the range of said oscillator at the lower end thereof.

6. A variable frequency oscillator comprising:

a transistor device having characteristics which vary as a function of frequency;

said transistor having a base electrode, a collector electrode and an emitter electrode;

a feedback capacitor connected across said collector electrode and said emitter electrode;

an output transformer connected to said collector electrode;

a varactor connected to said base electrode; and a source of control signals connected to said varactor, said control signals being variable over a predetermined range for varying the characteristics of said varactor to thereby vary the frequency of the voltage across said output transformer, said varactor operating as a variable capacitor in one portion of said range of said control signals and operating as a variable resistor in another portion of said range of said control signals.

7. Apparatus in accordance with claim 6 in which said frequency-dependent characteristics of said transistor form a portion of the frequency-determining properties of said oscillator.

8. Apparatus in accordance with claim 6 including an inductance connected between said varactor and said base electrode, said inductance and said varactor having a combined impedance Z which determines the frequency of oscillations of said oscillator.

9. A variable frequency oscillator, comprising:

a transistor having characteristics which vary as a function of frequency;

said transistor having a base electrode, a collector electrode and an emitter electrode;

a feedback capacitor connected across said collector electrode and said emitter electrode;

a source of potential for said transistor;

an output transformer connected between said collector electrode and said potential source, said transformer having an output tap;

an output circuit connected to said output tap;

an inductance;

a varactor serially connected with said inductance between said base electrode and ground; and a source of control signals connected to said varactor, said control signals being variable over a predetermined range for varying the characteristics of said varactor to thereby vary the frequency of the voltage across said output transformer, said varactor operating as a variable capacitor in one portion of said range of said control signals and operating as a variable resistor in another portion of said range of said control signals.

10. A variable frequency oscillator, comprising:

a transistor device having characteristics which vary as a function of frequency;

said transistor having a base electrode, a collector electrode and an emitter electrode;

a source of potential for said transistor;

an inductor connected between said potential source and said collector electrode;

an output circuit coupled to said inductor;

a varactor connected between said base electrode and said emitter electrode; and a source of control signals connected to said varactor, said control signals being variable over a predetermined range for varying the characteristics of said varactor to thereby vary the frequency of the voltage across said inductor, said varactor operating as a variable capacitor in one portion of said range of said control signals and operating as a variable resistor in another portion of said range of said control signals.

11. Apparatus in accordance with claim 10 including first resistance means connected between said inductor and said collector electrode; and second resistance means connected in parallel with said varactor between said base electrode and said emitter electrode.

No references cited.

ROY LAKE, *Primary Examiner.*

J. KOMINSKI, *Assistant Examiner.*